United States Patent [19]

Taguchi

[11] Patent Number: 5,321,282

[45] Date of Patent: Jun. 14, 1994

[54] INTEGRATED CIRCUIT HAVING A CHARGE COUPLED DEVICE AND MOS TRANSISTOR AND METHOD FOR MANUFACTURING THEREOF

[75] Inventor: Minoru Taguchi, Saitama, Japan

[73] Assignee: Kabushiki Kaisha Toshiba, Kawasaki, Japan

[21] Appl. No.: 845,267

[22] Filed: Mar. 3, 1992

[30] Foreign Application Priority Data

Mar. 19, 1991 [JP] Japan .................................. 3-054817

[51] Int. Cl.⁵ .......................... H01L 29/78; H01L 29/34
[52] U.S. Cl. ..................................... 257/215; 257/250; 257/369; 257/640
[58] Field of Search ............... 257/215, 249, 250, 640, 257/635, 324, 369

[56] References Cited

U.S. PATENT DOCUMENTS

| | | | |
|---|---|---|---|
| 3,834,959 | 9/1974 | Dennard et al. | 257/236 |
| 3,837,907 | 9/1974 | Berglund et al. | 257/249 |
| 3,911,560 | 10/1975 | Amelio et al. | 257/249 |
| 3,912,559 | 10/1975 | Harigaya et al. | 257/369 |
| 3,931,674 | 1/1976 | Amelio | 257/250 |
| 4,063,992 | 12/1977 | Hosack | 257/249 |
| 4,087,832 | 5/1978 | Jambotkar | 257/250 |
| 4,097,885 | 6/1978 | Walsh | 257/250 |
| 4,521,796 | 6/1985 | Rajkanan et al. | 257/324 |
| 4,652,339 | 3/1987 | Bluzer et al. | 257/249 |
| 4,994,888 | 2/1991 | Taguchi | 257/215 |
| 5,189,499 | 2/1993 | Izumi et al. | 257/222 |

FOREIGN PATENT DOCUMENTS

| | | |
|---|---|---|
| 2191274 | 2/1974 | France . |
| 61-158170 | 12/1986 | Japan . |
| 1418231 | 12/1975 | United Kingdom . |
| 0384692 | 8/1990 | United Kingdom . |

*Primary Examiner*—Ngan Ngo
*Attorney, Agent, or Firm*—Foley & Lardner

[57] ABSTRACT

An integrated circuit comprises a charge coupled device and an MOS transistor. The charge coupled device has a lower and an upper gate electrode on the substrate. The insulating film between the substrate and the electrodes comprises silicon nitride. The insulating film between the electrodes is formed by thermal oxidizing the lower gate electrode using the silicon nitride film as a mask.

5 Claims, 5 Drawing Sheets

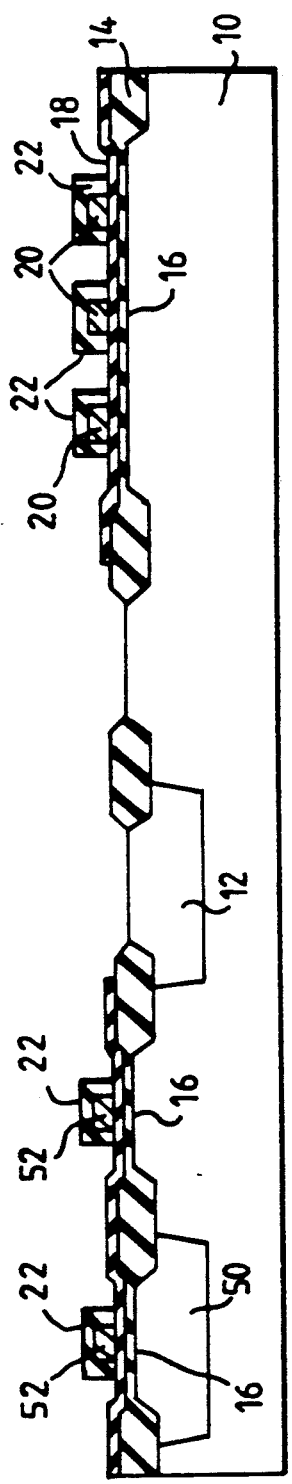
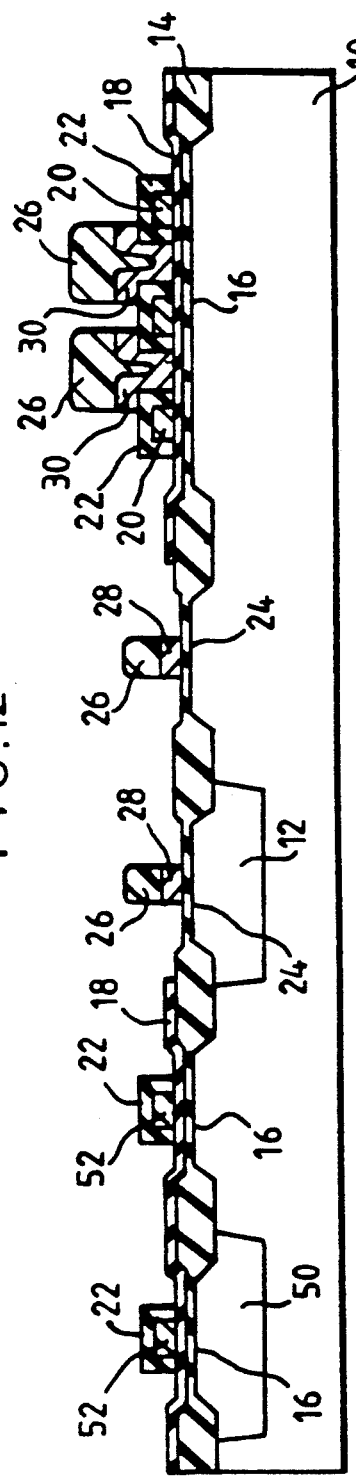
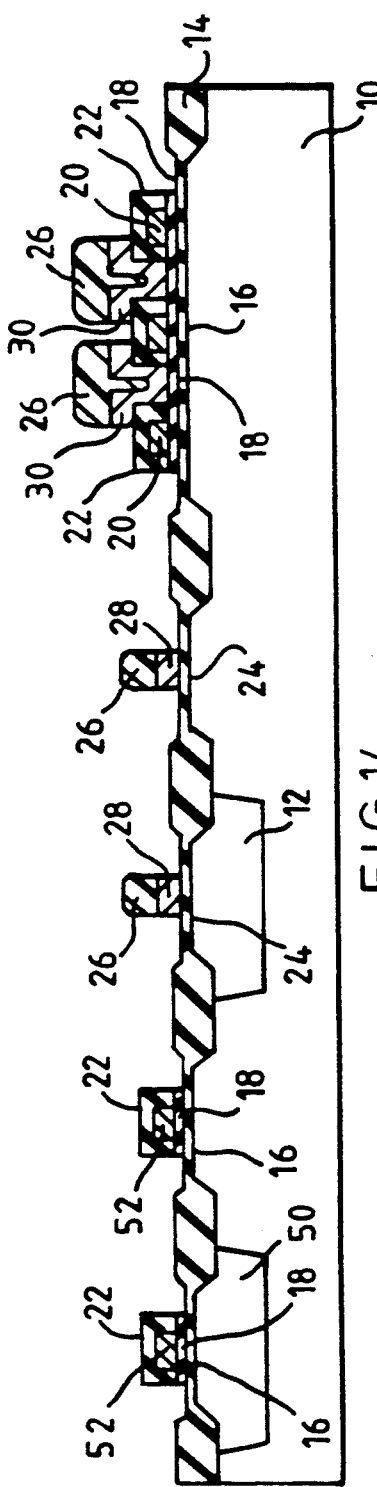

INTEGRATED CIRCUIT HAVING A CHARGE COUPLED DEVICE AND MOS TRANSISTOR AND METHOD FOR MANUFACTURING THEREOF

BACKGROUND OF THE INVENTION

1. Field of the invention

The present invention relates, in general, to integrated circuits and methods for manufacturing thereof. More specifically, the invention relates to a charge coupled device (CCD) which has a lower gate electrode and an upper gate electrode and a method for manufacturing thereof.

2. Description of the prior art

In general, a CCD device has a plurality of lower gate electrodes and a plurality of upper gate electrodes. The lower gate electrodes are formed on a semiconductor substrate via a gate insulating film. The upper gate electrodes are also formed on the semiconductor substrate via a gate insulating film and are located between the lower gate electrodes. The upper gate electrodes and the upper gate insulating film are partly overhanging and adjacent to lower gate electrodes. During the operation of the CCD, relatively high voltage (ex. 9 or 12 volts) is appled across each of the lower gate insulting film and the upper gate insulating film.

On the other hand, the CCD is usually formed with MOS transistors, each having a gate insulating film, in the semiconductor substrate as an integrated circuit. In this case, the gate insulating film of the MOS transistor is formed by the same process as for either the lower gate insulating film or the upper gate insulating film. During the operation of the MOS transistors, relatively low voltage (e.g., 5 volts) is applied across the MOS gate insulating film.

In the prior art integrated circuit which has CCD and MOS transistors, if the MOS gate insulating film is made thinner with the aim of increasing the integration of MOS transistor portion according to the scaling rule, the lower gate insulating film or the upper gate insulating film also becomes thinner due to the aforementioned manufacturing process. In this type of CCD, it causes insulation breakdown in the lower gate insulating film or the upper gate insulating film. Thus, increasing the integration without causing insulation breakdown is difficult.

In addition, because the lower gate insulating film and the upper gate insulating film of the prior art CCD are formed in different manufacturing steps, it is difficult to equalize the characteristics of the two insulating films of the CCD and to improve the data transfer performance of the CCD.

In addition, because the upper gate electrode is overlapped with the lower gate electrode via the upper gate insulating film, insulation breakdown between lower and upper gate electrodes of the prior art CCD may occur.

SUMMARY OF THE INVENTION

It is an object of the present invention to provide a CCD which has high breakdown voltage gate insulating film.

It is another object of the present invention to provide a CCD which has equalized characteristics of lower and upper gate insulating films.

It is a further object of the present invention to provide an improved method for manufacturing a CCD.

To accomplish the objects described above, the present invention provides an integrated circuit having a charge coupled device and a MOS transistor, comprising: a semiconductor substrate having a main surface including a first and a second area; an anti-oxidation insulating film formed on the surface of the first area a gate insulating film of the MOS transistor, having a first predetermined thickness formed on the surface of the second area; a lower gate electrode of the charge coupled device selectively formed on the anti-oxidation insulating film; an oxide film having a second predetermined thickness formed in contact with the lower gate electrode; and an upper gate electrode of the charge coupled device continuously formed on the anti-oxidation insulating film and the oxide film.

BRIEF DESCRIPTION OF THE DRAWINGS

The accompanying drawings, which are incorporated in and constitute a part of the specification, illustrate embodiments of the invention, and, together with the description, serve to explain the principles of the invention. Referring now to the drawings, like reference characters designate like or corresponding parts throughout the several views. Of the drawings:

FIGS. 9 to 16 are cross section view showing the steps for manufacturing the second embodiment of this invention.

DETAILED DESCRIPTION OF THE PREFERED EMBODIMENTS

First Embodiment

FIGS. 1 to 8 are respectively cross section drawings showing the manufacturing process sequence for the integrated circuit concerned in a first embodiment of this invention.

Figure 1:
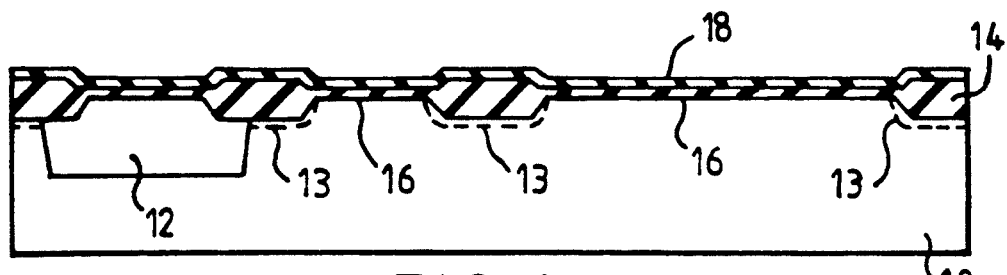
FIGS. 1 to 8 are cross section views showing the steps for manufacturing the first embodiment of this invention.

First, as shown in FIG. 1, n type impurity ions are implanted into the intended sites of formation of P-channel MOS transistors in p type silicon substrate 10 of resistivity approximately 20 [$\Omega \cdot$cm].

Next, n type well 12 is formed by thermal diffusion of the implanted ions. Then, channel stopper 13 and field oxide films 14 are formed on the surface of substrate 10 by the local oxidation of silicon (LOCOS) method, which is one of the most common isolation methods. Next, the surface of silicon substrate 10 to be exposed is oxidized in a mixed oxidation atmosphere of hydrochloric acid and oxygen, and first silicon oxide film 16 is formed with a thickness of approximately 70 [nm]. Then, silicon nitride film 18 with a thickness of approximately 70 [nm] is formed over first silicon oxide film 16 by vapor phase reaction using a method such as low-pressure chemical vapor deposition (LPCVD). The formed insulating film composed by oxide film 16 and nitride film 18 later becomes the gate insulating film of the CCD.

Figure 2:
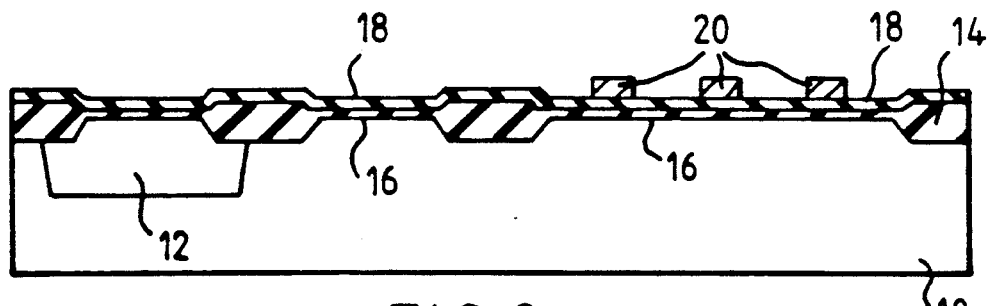

Next, as shown in FIG. 2, phosphorus, which is an n type impurity, is implanted into the intended site for the formation of the CCD on substrate 10 so that the CCD will become a buried channel type CCD, using a photoresist (not shown) as a mask.

Then, an undoped first layer of polysilicon of thickness approximately 400 [nm] is formed by the CVD method above substrate 10. Next, the first layer polysilicon is made n+ type, (conductive) by diffusing phosphorus, which is an n type impurity, at a temperature of approximately 950° C. Then, the first layer poly-silicon, which has been made n+ type, is patterned using photo-etching and reactive ion etching (RIE) techniques, and lower gate electrodes 20 of the CCD are formed.

Figure 3:
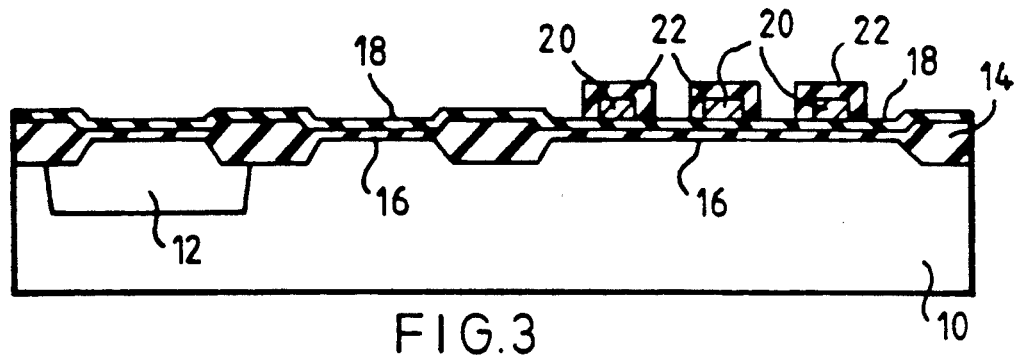

Next, as shown in FIG. 3, the surfaces of the lower gate electrodes 20 made of n+ type first layer polysilicon are selectively oxidized in a mixed oxidation atmosphere of hydrochloric acid and oxygen at a temperature of approximately 950° C., using silicon nitride film 18 as an anti-oxidation insulating film. By this means, second silicon oxide films 22 with a thickness of approximately 300 [nm] are formed around the surfaces of lower gates 20. These oxide films 22 later become the insulating films which isolate the lower gates and the upper gates of the CCD.

Figure 4:
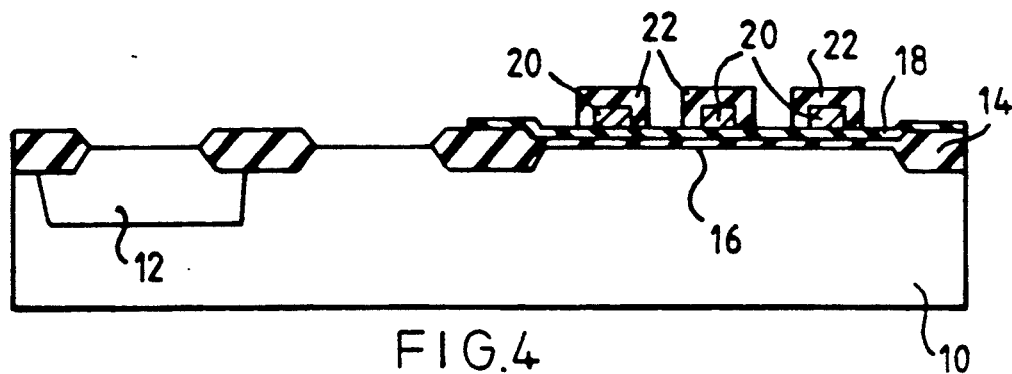

Next, as shown in FIG. 4, silicon nitride film 18 on the intended sites for the formation of the P-channel MOS transistors and the N-channel MOS transitors is removed, using a photo-resist (not shown) as a mask. Furthermore, first silicon oxide 16 is also removed.

Figure 5:
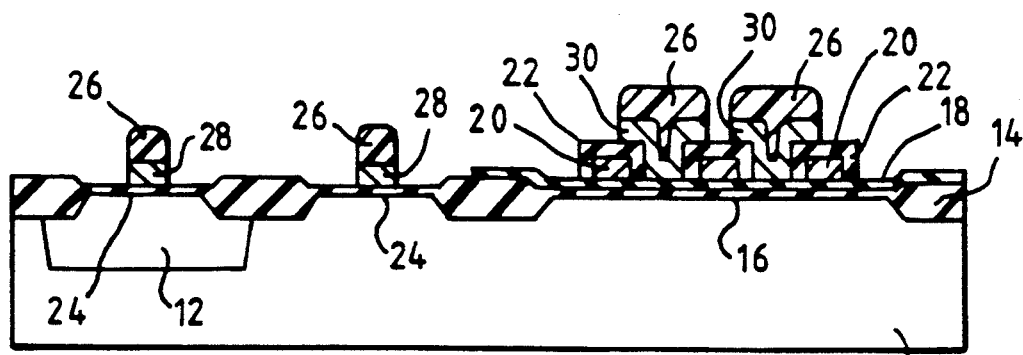

Then, as shown in FIG. 5, the exposed surfaces of silicon substrate 10 are oxidized in a mixed oxidation atmosphere of hydrochloric acid and oxygen at a temperature of approximately 950° C., and third silicon oxide films 24 with thicknesses of approximately 45 [nm] are formed. These oxide films 24 become the gate insulating films of the P-channel and the N-channel MOS transistors. Next, ion implantation for controlling the threshold voltages of the P-channel and the N-channel MOS transistors and ion implantation for making potential barriers for the CCD (formed beneath the upper gates and not shown) are respectively carried out by restricting the implantation areas with photo-resists. The ion type used for both these ion implantation is boron. Then, undoped second layer polysilicon is formed above substrate 10 with a thickness of approximately 400 [nm] by the CVD method. Next, this is made n+ type by diffusing phosphorus, which is an n type impurity, in the second layer polysilicon at a temperature of approximately 950° C. Then, the second layer polysilicon which has been made n+ type, is patterned by the RIE technique using photo-resists 26 as masks, and gate electrodes 28 of the P-channel and the N-channel MOS transistors and upper gate electrodes 30 of the CCD are formed.

Figure 6:
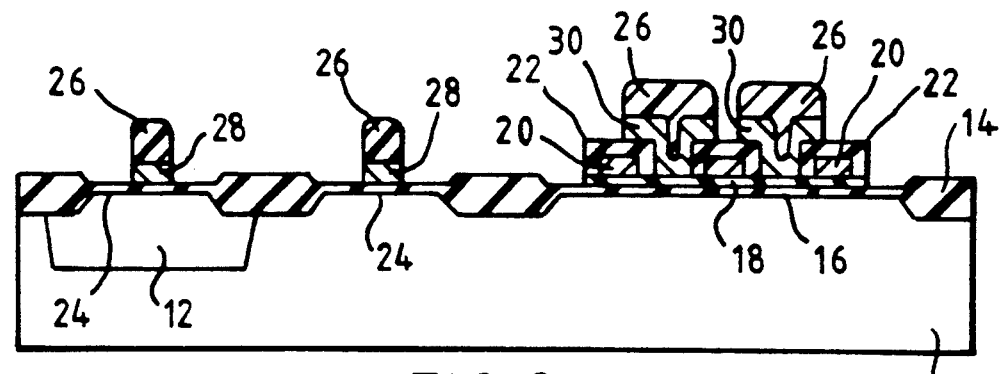

Next, as shown in FIG. 6, using an etchant which has a high selectivity between silicon nitride film and silicon oxide film, silicon nitride film 18 is selectively removed from above the intended sites for the formation of the source and the drain diffusion regions of the CCD, using photo-resists 26 and the silicon oxide films as masks.

Figure 7:
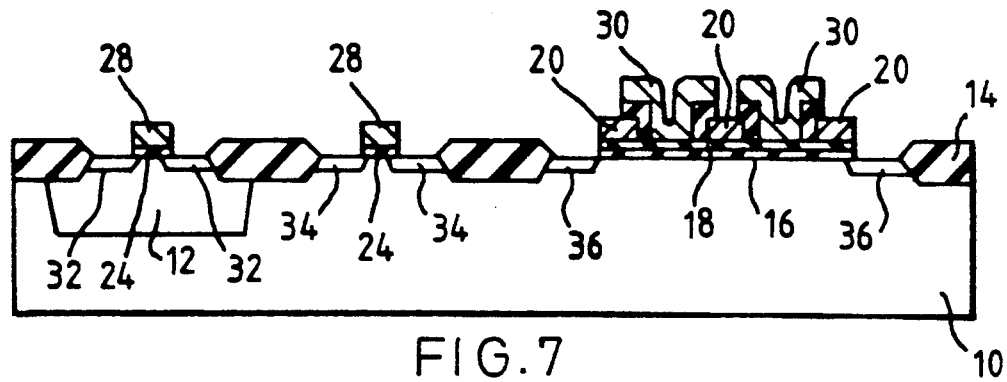

Then, as shown in FIG. 7, silicon oxide films 16 and 24, which are on the intended sites for the formation of the source and the drain diffusion regions of the MOS transistors and of the CCD, are selectively removed. After this photo-resist 26 is removed. Next, arsenic is selectively ion-implanted, using a photo-resist (not shown) as a mask, in order to form the source and the drain diffusion regions of the N-channel MOS transistors and of the CCD. Then, after the photo-resist has been removed, a thin oxide film is formed at a temperature of approximately 900° C. Next, in order to form the source and the drain diffusion region of the P-channel MOS transistor, boron is selectively ion-implanted, using a photo-resist (not shown) as a mask. N type diffusion regions 34 which become the source and the drain diffusion regions of the N-channel MOS transistor, n type diffusion regions 36 which become the source and of the drain diffusion regions of the CCD, and p type diffusion regions 32 which become the source and the drain regions of the P-channel MOS transistor are respectively obtained by these ion implantations.

Figure 8:
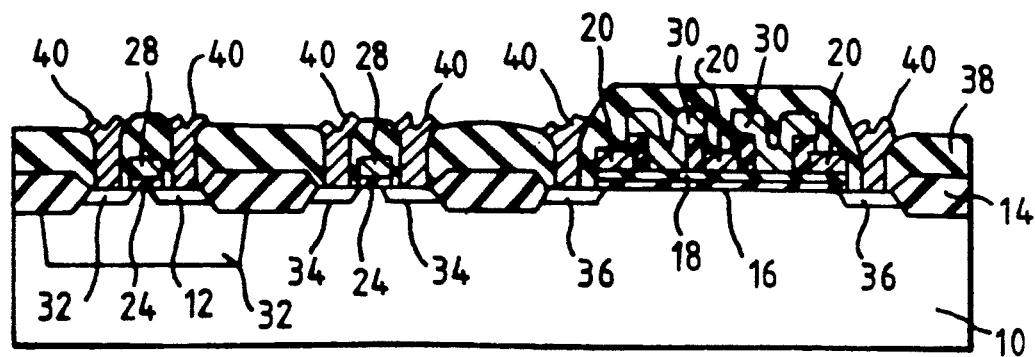

Then, as shown in FIG. 8, a CVD silicon oxide film is formed over the whole surface of the substrate by the CVD method. Next, a BPSG film is formed over this CVD silicon oxide film by changing the gas. By this means, an inter-layer insulating film 38 composed of the CVD silicon oxide film and the BPSG film is formed. Then, this is heat-treated at a temperature of approximately 950° C. By this heat-treatment, the smoothing of the inter-layer insulating film 38 and phosphorus-gettering by the BPSG film are performed while, at the same time, p type diffusion region 32 and n type diffusion regions 34 and 36 are activated. Next, using photo-etching and RIE techniques, contact holes passing through the inter-layer insulating film 38 on p type diffusion region 32 and n type diffusion regions 34 and 36 are selectively opened. Then, an alloy made of aluminum and silicon is deposited on the inter-layer insulating film 38, using the spattering technique. Next, this alloy film is patterned using photo-etching and RIE techniques, and the desired metal wiring 40 is formed. After this, the alloy which forms metal wiring 40 is sintered in a mixed gas atmosphere of nitrogen and hydrogen (forming gas) at a temperature of approximately 450° C. for about 15 minutes.

The integrated circuit concerned in the first embodiment is formed by the above method.

Using a device with the above construction, the gate insulating films of the CCD can be made thick and can also be made with silicon nitride film and silicon oxide film, regardless of the film thickness of the gate insulating films of the MOS transistors. By this means, the breakdown voltage between lower and upper gates 20 and 30 of the CCD and substrate 10 is increased. Furthermore, the breakdown voltage between lower gates 20 and upper gates 30 also are increased by second silicon oxide films 22 which have been thickly formed using a silicon nitride film as the anti-oxidation insulating film. From these results, the breakdown voltage of the CCD is improved as a whole.

Also, the gate insulating films of lower gates 20 and the gate insulating films of upper gates 30 are composed of the same material and are formed in the same process. Therefore, there is no difference in the film qualities and film thicknesses of the gate insulating films of the lower and upper gates, and a CCD with high reliability and high performance can be obtained. The yield is also increased.

In addition, in the CMOS circuit section composed of the MOS transistors, a gate insulating film made from a third silicon oxide film which is different from the gate insulating films of the CCD can be obtained. For this reason, its film thickness can be freely determined without any interference with the formation of the CCD gate insulating films and the film thickness can be made thinner. By this means, the miniaturization of the MOS transistors can be designed. Also, addition or expansion of functions and speeding-up of operation in the integrated circuit can be easily achieved.

Second Embodiment

The second embodiment is an example in which this invention is applied to an integrated circuit provided with high breakdown voltage type MOS transistors for analog circuits such as an output circuits of operational amplifiers.

FIGS. 9 to 16 are respectively cross section drawings showing the manufacturing process sequence for the integrated circuit concerned in the second embodiment of this invention. In FIGS. 9 to 16, the same reference numbers are given to the same components as in FIG. 1 to 8.

Figure 9:
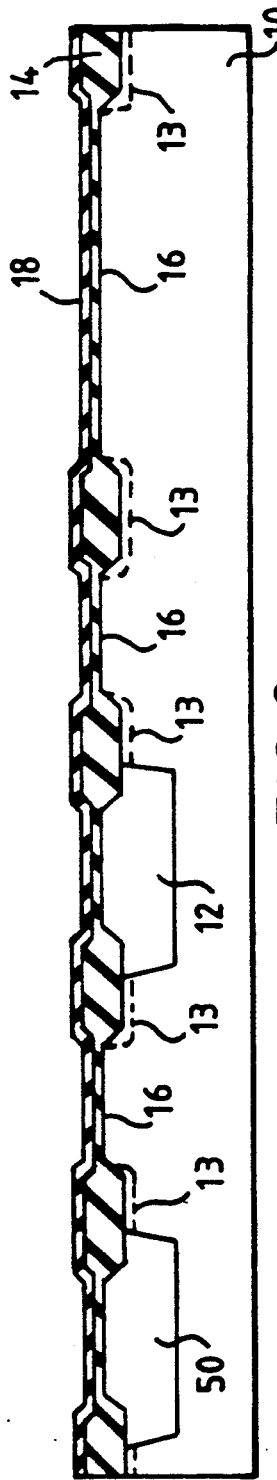

First, as shown in FIG. 9, n type wells 12 and 50 are respectively formed in p type silicon substrate 10 by the same method as that described in FIG. 1. Next, after field oxide films 14 have been formed, first silicon oxide films 16 are formed on the surface of substrate 10 to be exposed, and silicon nitride film 18 is continuously formed on these.

Figure 10:
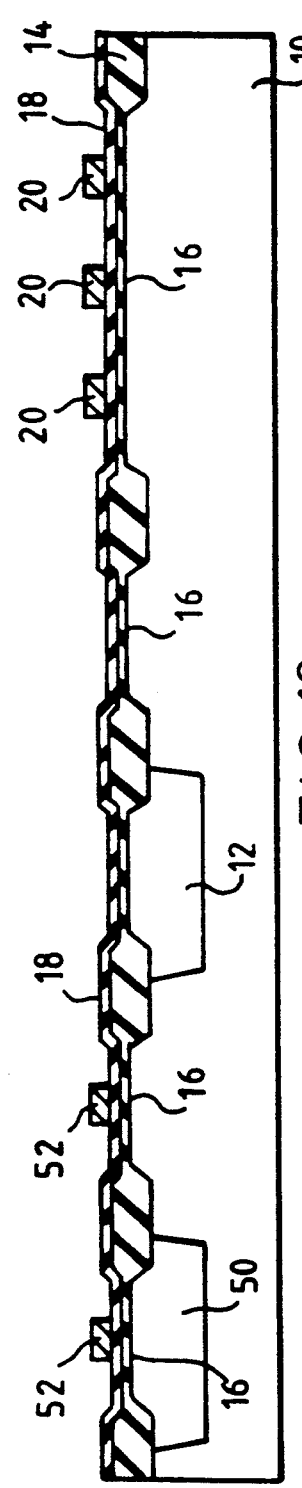

Then, as shown in FIG. 10, an undoped first layer of polysilicon of thickness approximately 400 [nm] is formed by the CVD method above substrate 10, using the same method as that described in FIG. 2, and after this it is made n+ type (conductive). Next, the first layer polysilicon, which has been made n+ type, is patterned using photoetching and RIE techniques, and lower gates 20 of the CCD and gates 52 of high breakdown voltage type P-channel and N-channel MOS transistors are respectively formed.

Figure 11:
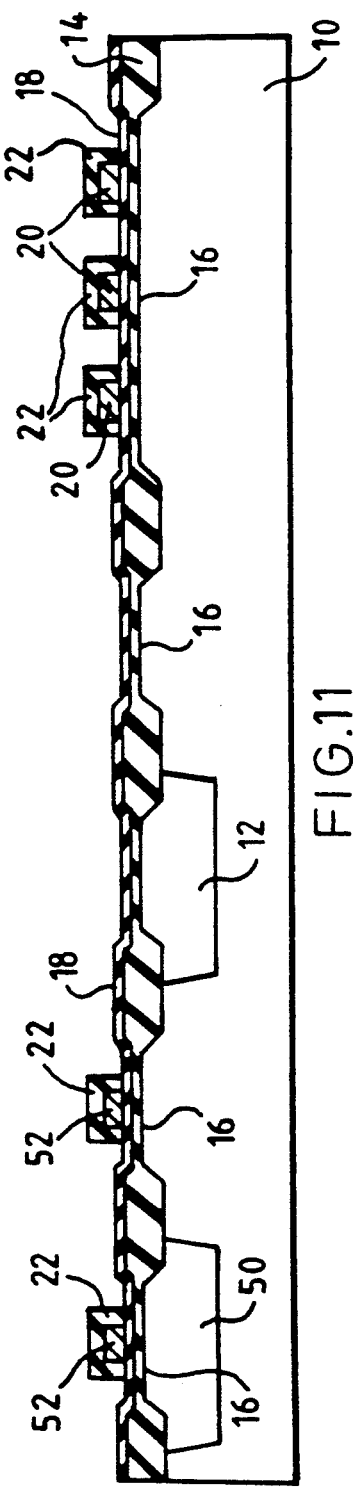

Then, as shown in FIG. 11, the surfaces of lower gates 20 and gates 52 only are selectively and comparatively thickly oxidised, using silicon nitride film 18 as an anti-oxidation insulating film, by the same method as that in FIG. 3, and second silicon oxide films 22 with a thickness of approximately 300 [nm] are formed around the gates 20 and 52.

Next, as shown in FIG. 12, silicon nitride film 18 and first silicon oxide film 16 on the intended sites for the formation of the P-channel MOS transistor and the N-channel MOS transistor other than the high breakdown voltage types (hereafter called the common types) are removed, by the same method as that described in FIG. 4.

Then, as shown in FIG. 13, third silicon oxide films 24 are formed on the intended sites for the formation of the common type MOS transistors by the same method as that described in FIG. 5. Next, undoped second layer polysilicon is formed above the substrate with a thickness of approximately 400 [nm] by the CVD method. After this, it is made n+ type. Then, second layer polysilicon which has been made n+ type, is patterned by the RIE technique using photoresists 26 as masks, and gates 28 of the common type P-channel and N-channel MOS transistors and upper gates 30 of the CCD are formed.

Next, as shown in FIG. 14, silicon nitride film 18 is selectively removed from above the intended sites for the formation of the source and the drain diffusion regions of the high breakdown voltage type MOS transistors and the source and the drain diffusion regions of the CCD, using an etchant with high selectivity between silicon nitride film and silicon oxide film and using photo-resists 26 and the silicon oxide films as masks, by the same method as that described in FIG. 6.

Figure 15:
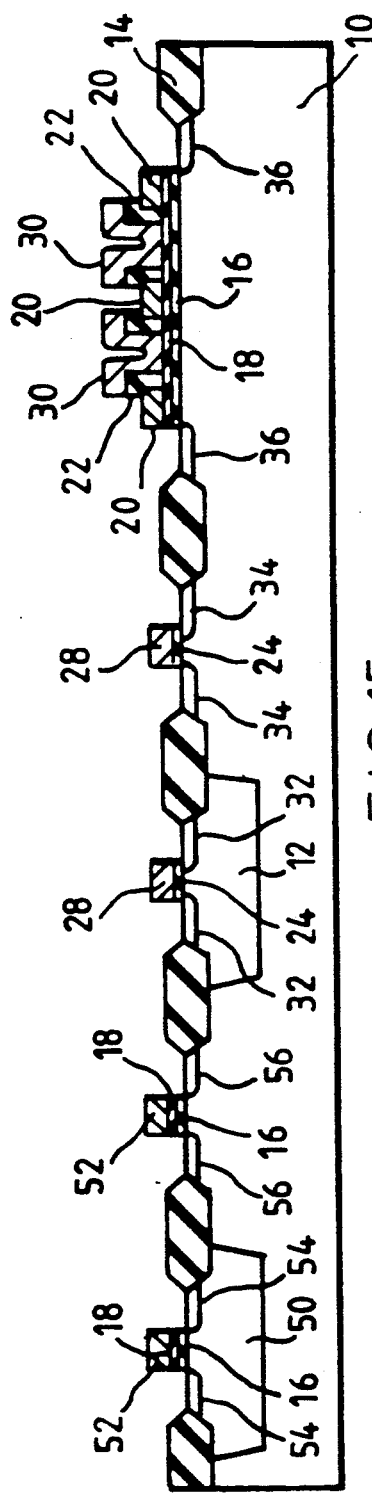

Then, as shown in FIG. 15, silicon oxide films 16 and 24, which are on the intended sites for the formation of the source and the drain diffusion regions of the MOS transistors and of the CCD, are selectively removed by the same method as that described in FIG. 7. After this, arsenic is selectively ion-implanted, using a photo-resist (not shown) as a mask, in order to form the source and the drain diffusion regions of the N-channel MOS transistors and of the CCD. Then, after the photo-resist has been removed, a thin oxide film is formed at a temperature of approximately 900° C. Next, in order to form the source and the drain diffusion regions of the P-channel MOS transistors, boron is selectively ion-implanted, using a photo-resist (not shown) as a mask. N type diffusion regions 34 and 56 which become the source and the drain diffusion regions of the N-channel MOS transistors, n-type diffusion regions 36 which become the source and the drain diffusion regions of the CCD, and p type diffusion regions 32 and 54 which become the source and the drain regions of the P-channel MOS transistors are respectively obtained by these ion implantations.

Figure 16:
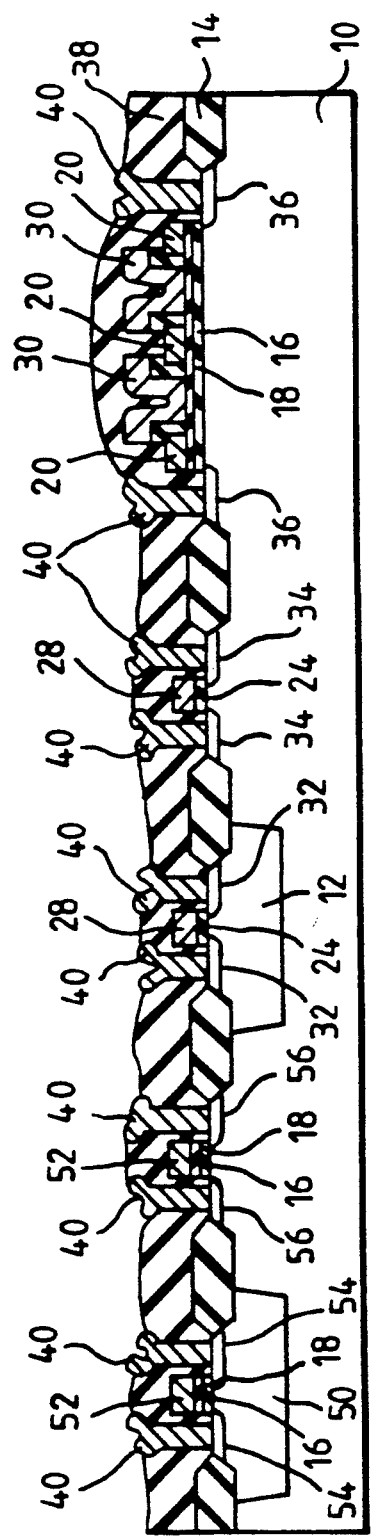

Then, as shown in FIG. 16, inter-layer insulating film 38 composed of a CVD silicon oxide film and a BPSG film is formed by the CVD method over the whole surface of the substrate. Next, this is heat-treated and the smoothing of the inter-layer insulating film 38 and phosphorus-gettering by the BPSG film are performed while, at the same time, p type diffusion regions 32 and 54 and n type diffusion regions 34, 36 and 56 are activated. Next, contact holes passing through the inter-layer insulating film 38 on the p type diffusion regions 32 and 54 and n type diffusion regions 34, 36 and 56 are selectively opened. After this, an alloy made of aluminum and silicon is deposited on inter-layer insulating film 38. Next: this alloy film is patterned and the desired metal wiring 40 is formed. After this, the alloy which forms metal wiring 40 is sintered.

The integrated circuit concerned in the second embodiment is formed by the above method.

Using a device with the above construction, in the same way as in the first embodiment, comparatively thick insulating films can be formed for the gate insulating films of the CCD, and thinner insulating films than these can be formed for the gate insulating films of the common type MOS transistors, respectively. Thus, improvement of the breakdown voltage of the CCD and miniaturization of the CMOS circuit section can be achieved. Furthermore, by using the silicon nitride film and the silicon oxide film which forms the gate insulating films of the CCD as the gate insulating film of the high breakdown voltage type MOS transistors, there is no increase in processes, and the high breakdown voltage type MOS transistors can be formed on the same chip. These high breakdown voltage type MOS transistors can be used in any desired CMOS analog circuit which uses high breakdown voltage, such as output circuits of operational amplifiers. Also, the above common type MOS transistors can be used in CMOS digital circuits. By this means, CMOS analog circuits can be formed with high breakdown voltage MOS transistors and also CMOS digital circuits can be formed with highly integrated, high operating speed MOS transistors. Thus, an integrated circuit system with even higher performance can be achieved.

The present invention has been described with respect to specific embodiments. However, other embodiments based on the principles of the present invention should be obvious to those of ordinary skill in the art. Such embodiments are intended to be covered by the claims.

For instance, n+ type polysilicon was used in the conductive layer which forms the gates. However, it is also possible to use such other materials as high melting point metal silicides and laminated films of high melting point metal silicides and polysilicon (polycides). Also, a silicon nitride film was used as the anti-oxidation insulating film for selectively oxidizing only the surfaces of the gates which were formed with these types of conductive layer. However, it is also possible to use other types of anti-oxidation insulating films. At this time, it is desirable from the viewpoint of simplified production processing and improved breakdown voltage that the anti-oxidation insulating films have, as far as possible, the same insulation as the silicon nitride film and can be applied as the CCD and high breakdown voltage type MOS transistor gate insulating films.

What is claimed is:

1. An integrated circuit having a charge coupled device and a MOS transistor, comprising:
   a semiconductor substrate having a main surface including first and second areas;
   an anti-oxidation insulating film formed above the surface of the first area;
   a gate insulating film of the MOS transistor, having a first predetermined thickness formed on the surface of the second area;
   a lower gate electrode of the charge coupled device selectively formed on the anti-oxidation insulating film;
   a thick oxide film having a second predetermined thickness formed in contact with the lower gate electrode, the gate insulating film being thinner than the thick oxide film;
   an upper gate electrode of the charge coupled device continuously formed on the anti-oxidation insulating film and the thick oxide film; and
   a second oxide film formed between the semiconductor substrate and the anti-oxidation insulating film,
   wherein said thick oxide film is provided for increasing the breakdown voltage between the lower and upper gate electrodes of the charge coupled device and wherein said second oxide film is provided for increasing the breakdown voltage between the lower and upper gate electrodes of the charge coupled device and the semiconductor substrate.

2. The integrated circuit of claim 1, wherein the anti-oxidation insulating film comprises silicon nitride and the oxide film comprises silicon oxide.

3. An integrated circuit having a charge coupled device and first and second MOS transistors, comprising:
   a semiconductor substrate having a main surface including a first, a second, and a third areas;
   an anti-oxidation insulating film formed above the surface of the first and the second areas;
   a gate insulating film of the first MOS transistor, having a first predetermined thickness, formed above the surface of the third area;
   a lower gate electrode of the charge coupled device selectively formed on the anti-oxidation insulating film of the first area;
   a thick oxide film having a second predetermined thickness formed in contact with the lower gate electrode, the gate insulating film being thinner than the thick oxide film;
   an upper gate electrode of the charge coupled device continuously formed on the anti-oxidation insulating film and the oxide film;
   a gate electrode of the second MOS transistor formed on the anti-oxidation insulating film of the second area; and
   a second oxide film formed between the semiconductor substrate and the anti-oxidation insulating film,
   wherein said thick oxide film is provided for increasing the breakdown voltage between the lower and upper gate electrodes of the charge coupled device, and wherein said second oxide film is provided for increasing the breakdown voltage between the lower and upper gate electrodes of the charge coupled device and the semiconductor substrate.

4. The integrated circuit of claim 3, wherein the anti-oxidation insulating film comprises silicon nitride and the oxide film comprises silicon oxide.

5. The integrated circuit of claim 1 wherein the gate insulating film is thinner than the combined thicknesses of the anti-oxidation insulating film and the second oxide film.

* * * * *